United States Patent [19]

Osborn

[11] Patent Number: 4,860,152

[45] Date of Patent: Aug. 22, 1989

[54] TWO STAGE PROTECTION CIRCUIT FOR A POWER MOSFET DRIVING AN INDUCTIVE LOAD

[75] Inventor: Douglas B. Osborn, Kokomo, Ind.

[73] Assignee: Delco Electronics Corporation, Kokomo, Ind.

[21] Appl. No.: 303,423

[22] Filed: Jan. 30, 1989

[51] Int. Cl.$^4$ .............................................. H02H 3/00
[52] U.S. Cl. ...................................... 361/91; 361/33; 361/111
[58] Field of Search ...................... 361/88, 91, 111, 56, 361/33

[56] References Cited

U.S. PATENT DOCUMENTS

| | | | |
|---|---|---|---|
| 4,679,112 | 7/1987 | Craig | 361/33 X |
| 4,691,263 | 9/1987 | Kenny et al. | 361/91 X |
| 4,745,510 | 5/1988 | McMurray | 361/56 |
| 4,752,852 | 6/1988 | Agi et al. | 361/91 X |

Primary Examiner—Derek S. Jennings
Attorney, Agent, or Firm—Mark A. Navarre

[57] ABSTRACT

A snubber circuit comprising two stages regulates the gate current of a MOSFET in relation to the drain voltage at turnoff to clamp transient inductive voltages to a nondestructive level. At the onset of the turnoff, a current source is activated to discharge the gate capacitance, and the snubber controls the magnitude of such current in relation to the sensed drain voltage to stabilize the drain voltage at a nondestructive level. When the drain voltage approaches its limit value, a current injection circuit supplies additional current to the gate to sustain the MOSFET conduction, again in relation to the sensed drain voltage. When the inductive energy stored in the load is substantially dissipated, the drain voltage falls; at such point, the current injection circuit is disabled and the conduction of the current source is increased to complete the turnoff of the MOSFET.

4 Claims, 1 Drawing Sheet

TWO STAGE PROTECTION CIRCUIT FOR A POWER MOSFET DRIVING AN INDUCTIVE LOAD

This invention relates to a transient inductive voltage protection circuit or snubber, for power metal oxide semiconductor field effect transistor (MOSFET), and more particularly to a protection circuit which may be conveniently fabricated as an integrated circuit (IC).

BACKGROUND OF THE INVENTION

Voltage snubber circuits are generally employed in control applications where a transistor is required to interrupt the supply of current to an inductive load. The voltage transient VL at the instant of current interruption is given by the expression:

$$V_L = L * (di_L/dt) \quad (1)$$

where L is the inductance of the load and $(di_L/dt)$ is the rate of change in the load current $i_L$.

Snubber circuits characterized by the circuit of this invention limit the transient voltage $V_L$ by controlling the turnoff rate of the transistor. A conventional circuit of this type is depicted in FIG. 1, in the environment of an automotive fuel injector driver circuit. In that figure, the circuit 10 is employed to bias the MOSFET 12 on and off to periodically energize the solenoid coil 14 of a conventional fuel injector. The automotive ignition voltage (IGN) is supplied to the unswitched terminal of the coil 14, and a second voltage ($2V_{cc}$) is provided for biasing the MOSFET conductive when connected to its gate (g) via closure of the switch 18. The capacitors 32 and 34 are internal to the MOSFET 12 and represent the inherent gate-to-drain ($C_{gd}$) and gate-to-source ($C_{gs}$) capacitances, respectively. The remaining circuit elements—diode 20, Zener diode 22, resistor 24, capacitor 26 and current source 28—form the voltage snubber. The snubber circuit is activated at turnoff of the MOSFET 12 by opening switch 18 and closing switch 30.

When switch 18 is closed and switch 30 is open, the gate g is raised substantially to $2V_{cc}$ and the MOSFET 12 is biased conductive in its drain-to-source circuit. In this mode, the diode 20 is reverse biased to block control signal loss through Zener diode 22, resistor 24 and the drain-to-source circuit of MOSFET 12.

When switch 18 is opened and switch 30 is closed to interrupt the conduction of MOSFET 12, the current source 28 starts discharging the gate capacitance $C_{gs}$, and the drain-to-source voltage $V_{ds}$ rises abruptly in relation to expression (1) as the MOSFET 12 attempts to interrupt the coil current $i_L$. The rise in the drain voltage $V_{ds}$ forward biases diode 20 and quickly exceeds the breakdown voltage of Zener diode 22. At such time, the Zener diode 22 conducts current to the gate g via the limiting resistor 24 to maintain a partial conduction of the MOSFET 12. This serves to reduce the drain voltage $V_d$ by reducing the rate of change of current through the coil 14. Eventually, the drain voltage $V_{ds}$ falls below the breakdown voltage of Zener diode 22, and the current source 28 completes the turnoff of MOSFET 12. The capacitor 26 is required to prevent rapid changes in the gate voltage $V_g$ and the instability which would otherwise occur.

Although relatively simple, the voltage snubber circuit described above has some drawbacks. Most significantly, the capacitance (capacitor 26) required for stability prolongs the turn-on and turn-off times. This limits the time response of the circuit and is a serious drawback in an application such as a fuel injector driver, where fast speed of response is important. Moreover, the cost of the external components 20, 22, 24 and 26, as well as the circuit board space required for their assembly, is substantial.

SUMMARY OF THE PRESENT INVENTION

The present invention is directed to a MOSFET snubber circuit which adequately protects the MOSFET from transient inductive voltages while avoiding the above-mentioned drawbacks associated with conventional snubber circuits. As described below, the snubber circuit of this invention eliminates the requirement for a stabilizing capacitor and integrates with the driver circuits all but a pair of relatively low wattage resistors used to sense the drain voltage.

According to the present invention, turnoff of the MOSFET is controlled in response to the sensed drain voltage by two circuit stages. At the onset of the turnoff, a current source is activated to discharge the gate capacitances, and the snubber controls the magnitude of such current in relation to the sensed drain voltage to stabilize the drain voltage at a nondestructive level. When the drain voltage approaches its limit value, a current injection circuit supplies additional current to the gate to sustain the MOSFET conduction, again in relation to the sensed drain voltage. When the inductive energy stored in the load is substantially dissipated, the drain voltage falls; at such point, the current injection circuit is disabled and the conduction of the current source is increased to complete the turnoff of the MOSFET. Since the gate current of the MOSFET is continuously regulated in relation to the rise in drain voltage, the internal capacitance of the MOSFET is sufficient to ensure stability and no supplemental capacitance is required.

DETAILED DESCRIPTION OF THE INVENTION

Figure 1:
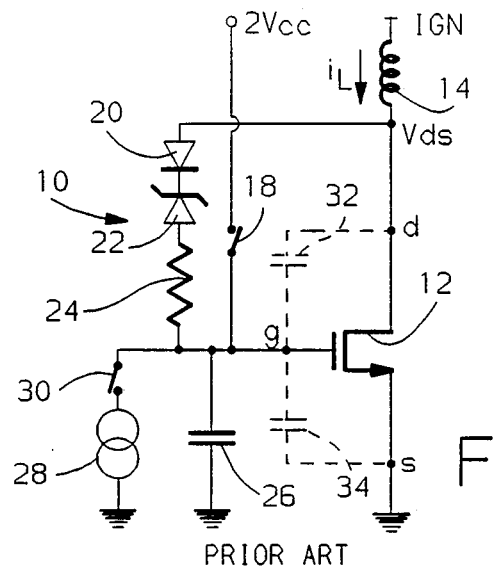
FIG. 1 is a circuit diagram of a MOSFET driver for an inductive load, including a conventional inductive voltage snubber circuit for protecting the MOSFET when it attempts to interrupt the load current.
Figure 2:
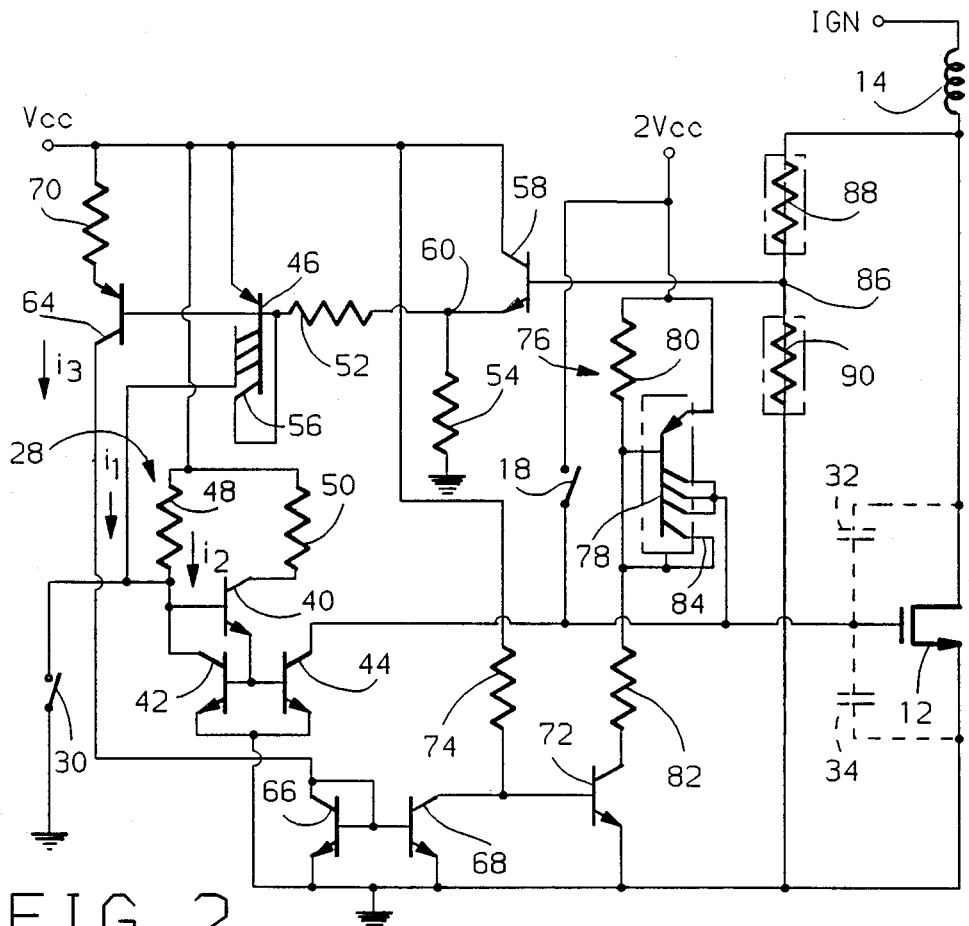
FIG. 2 is a circuit diagram of a MOSFET driver for an inductive load, including the inductive voltage snubber circuit of this invention.

Referring to FIG. 2 and the inductive voltage snubber circuit of this invention, the circuit elements described above in reference to FIG. 1 have been assigned the same reference numerals. Thus, the switch 18 periodically opens and closes to forward bias the MOSFET 12, and the switch 30 opens and closes with switch 18 to enable the snubber circuit at the MOSFET turnoff. The reference numerals for coil 14 and internal MOSFET capacitances 32, 34 are also repeated. Likewise, the coil is energized by the ignition voltage IGN and an auxiliary high source, $2V_{cc}$, is provided for forward biasing MOSFET 12. In contrast to the driver circuit shown in FIG. 1, however, only two devices of the driver circuit shown in FIG. 2 (resistors 88, 90) are external to the transistor control logic, which is preferably mechanized in the form of an integrated circuit.

A current source generally corresponding to the current source 28 of FIG. 1 is defined by a current mirror circuit comprising the transistors 40, 42, 44 and 46 and the resistors 48 50, 52 and 54. The reference current of the mirror circuit is defined by the sum of the collector current $i_1$ of multi-collector transistor 46 and the current $i_2$ through the resistor 48.

During conduction of the MOSFET 12, the switch 30 is closed to bias the transistors 40, 42 and 44 nonconductive and to sink the currents $i_1$ and $i_2$. The current $i_2$ is relatively small and is defined by resistor 48. The current $i_1$ is determined by the current in the reference collector 56 of transistor 46, which is connected to ground with the transistor base through the resistors 52 and 54. As indicated, the current $i_1$ is three times that in the reference collector 56. The transistor 58 is nonconductive and as described below, comes into effect during turnoff increase the voltage at terminal 60 for controlling the reference current component $i_1$.

A second current mirror circuit is defined by the transistors 64, 66 and 68 and the resistors 70, 52 and 54. The reference current $i_3$ is defined by resistor 70 and the transistor 64, which is forward biased through resistors 52 and 54. The reference current $i_3$ forward biases transistor 66, producing a mirrored current of approximately the same magnitude in the emitter-collector circuit of transistor 68. The collector of transistor 68 is connected directly to the base of transistor 72 and via the pull-up resistor 74 to an auxiliary supply voltage designated herein as $V_{cc}$. Transistor 72, in turn, controls the operation of a current injection circuit, generally designated by the reference numeral 76. During conduction of the MOSFET 12, the transistor 58 is nonconductive, and the current mirrored by the reference current $i_3$ is sufficiently large to bias the transistor 72 nonconductive, deactivating the current injection circuit 76. As described below, the transistor 58 becomes conductive during turnoff to increase the voltage at terminal 60; this reduces the reference current $i_3$ and allows the transistor 72 to become forward biased through resistor 74.

The current injection circuit 76 comprises resistors 80 and 82, and a multi-collector transistor 78 connected between the high voltage source $2V_{cc}$ and the gate g of MOSFET 12. When the transistor 72 is forward biased, the transistor 78 also becomes forward biased and the current thereby injected into the gate g of MOSFET 12 is determined by the current in the reference collector 84.

The drain-to-source voltage $V_{ds}$ of MOSFET is detected by the voltage at the junction 86 of a resistor divider comprising the external resistors 88 and 90. The junction 86 is connected to the base of transistor 58, which becomes forward biased only when the drain voltage reaches an upper threshold defined by the divider resistor 52, 54 and 88, 90. During conduction of MOSFET 12, $V_{ds}$ is very low and the transistor 58 is reverse biased. However, the drain voltage rises sufficiently during turnoff of the MOSFET 12 to forward bias the transistor 58 for the purpose of reducing the reference currents $i_1$ and $i_3$ as described below.

When switch 18 is opened to remove the forward bias voltage from the gate g of MOSFET 12, the switch 30 opens and the transistor 40 is biased conductive by the reference currents $i_1$ and $i_2$. The emitter-collector current of transistor 40 biases the transistor pair 42, 44 conductive through the resistor 50, and the reference currents $i_1$ and $i_2$ combine to form the mirror reference current through the emitter-collector circuit of transistor 44. Due to the relative areas of the transistors 42 and 44, the transistor 44 conducts a current of approximately eight times that of the reference current $(i_1+i_2)$. This begins discharging the gate capacitance $C_{gs}$ of MOSFET 12 to interrupt the current in coil 14. At this point, the operation of the remaining circuit elements is essentially unchanged.

As the gate capacitance $C_{gs}$ is discharged, the MOSFET 12 begins to turn off, and the drain voltage $V_{ds}$ rises abruptly due to the inductive energy stored in coil 14. When the potential at the voltage divider terminal 86 exceeds the voltage at terminal 60 by a diode voltage drop, the transistor 58 becomes forward biased. This supplies additional current through resistor 54 and increases the voltage at terminal 60.

The increase in voltage at terminal 60 increases the base voltage of both transistors 46 and 64, thereby reducing the current conducted through their emitter-collector circuits. Regarding transistor 46, this reduces the reference current component $i_1$, decreasing the conduction of the current mirror transistors 40, 42 and 44. This reduces the rate of discharge of the MOSFET gate capacitance $C_{gs}$ and stabilizes the drain voltage $V_{ds}$ at a nondestructive level even without an external gate capacitor, such as the capacitor 26 of FIG. 1. Even if transistor 46 is biased completely off, a limited current sinking ability is maintained due to the continued presence of reference current $i_2$.

The decrease in conduction of the transistor 64 reduces the conduction of the current mirror transistors 66 and 68, allowing the base voltage of transistor 72 to rise. As the drain voltage approaches its limit value, the transistor 72 becomes forward biased through the resistor 74, allowing the current injection circuit 76 to supply additional current to the MOSFET gate g through the parallel connected collectors of transistor 78.

When the inductive energy of coil 14 is substantially dissipated, the drain voltage begins to fall, increasing the conduction of both transistors 46 and 64. The conduction increase of transistor 64 turns off the transistor 72, which in turn, turns off the current injection circuit 76. The conduction increase of transistor 46 increases the conduction of the current mirror transistors 40, 42 and 44 until the gate capacitance $C_{gs}$ is completely discharged, thereby completing the interruption of current in coil 14.

As indicated above, the two stage operation of the snubber circuit of this invention adequately protects the MOSFET 12 while reducing the number of external snubber components and obviating the need for supplemental gate capacitance. This reduces the time required to change the conduction state of the MOSFET 12, and at the same time, reducing the overall cost of the driver.

While this invention has been described in reference to the illustrated embodiment, various modifications will occur to those skilled in the art, and it will be understood that circuits incorporating such modifications may fall within the scope of this invention, which is defined by the appended claims.

The embodiments of the invention in which an exclusive property or privilege is claimed are defined as follows:

1. In a supply circuit where a control terminal of a power transistor is periodically supplied with a conduction producing control signal which causes such power transistor to supply current to an inductive load, a turn off circuit for interrupting the load current and protecting the power transistor from damage due to the generation of transient inductive voltages when the conduction producing control signal is removed, the turn off circuit comprising:

- means for detecting the magnitude of the transient inductive voltage seen by the power transistor;
- current sinking means activated when the conduction producing control signal is removed for sinking current from the control terminal of the power transistor, the magnitude of such current being regulated in relation to said detected voltage to thereby stabilize the rate of increase of the transient inductive voltage seen by the power transistor; and
- current sourcing means activated as said detected voltage approaches a limit value for supplying supplemental current to the control terminal of the power transistor to sustain its conduction until the energy stored in said inductive load is substantially dissipated, whereafter the current sinking means completes the turn off of the power transistor.

2. The turn off circuit of claim 1, wherein said current sinking means comprises:

- a current mirror circuit which sinks current from the control terminal of said power transistor in relation to a reference current supplied thereto; and
- reference current means for supplying a reference current to said current mirror circuit which is relatively large when the conduction producing control signal is first removed. and which thereafter decreases in substantial relation to the consequent increase in said detected voltage.

3. The turn off circuit of claim 1, wherein said current sinking means comprises:

- a current mirror circuit which sinks current from the control terminal of said power transistor in relation to a reference current supplied thereto;
- reference current means for supplying a reference current to said current mirror circuit which is relatively large when said current sinking means is activated; and
- voltage responsive means effective when said detected voltage exceeds a threshold voltage for reducing the current supplied by said reference current means in relation to further increases in said detected voltage.

4. In a supply circuit where a control terminal of a power transistor is periodically supplied with a conduction producing control signal which causes such power transistor to supply current to an inductive load, a turn off circuit for interrupting the load current and protecting the power transistor from damage due to the generation of transient inductive voltages when the conduction producing control signal is removed, the turn off circuit comprising:

- means for detecting the magnitude of the transient inductive voltage seen by the power transistor;
- current sinking means including a first current mirror for sinking current from the control terminal of the power transistor in relation to the magnitude of a first reference current which is relatively large at the time said conduction producing control signal is removed;
- current sourcing means including a second current mirror for supplying supplemental current to the control terminal of the power transistor in relation to the magnitude of a second reference current which is relatively small at the time said conduction producing control signal is removed; and
- voltage responsive means effective when said detected voltage exceeds a threshold voltage for (1) reducing the first reference current in relation to further increases in said detected voltage, to thereby stabilize the rate of increase of the transient inductive voltage seen by the power transistor, and (2) increasing the second reference current in relation to further increases in said detected voltage, to thereby sustain the conduction of the power transistor until the energy stored in said inductive load is substantially dissipated.

* * * * *